US006097080A

United States Patent [19]

Nakanishi et al.

[11] Patent Number: 6,097,080

[45] Date of Patent: Aug. 1, 2000

[54] SEMICONDUCTOR DEVICE HAVING MAGNETIC SHIELD LAYER CIRCUMSCRIBING THE DEVICE

[75] Inventors: Tsutomu Nakanishi, Tokyo; Akira Okamoto, Saitama, both of Japan

[73] Assignees: Susumu Okamura; Takeshi Ikeda, both of Tokyo, Japan

[21] Appl. No.: 09/171,455

[22] PCT Filed: Apr. 23, 1997

[86] PCT No.: PCT/JP97/01412

§ 371 Date: Oct. 19, 1998

§ 102(e) Date: Oct. 19, 1998

[87] PCT Pub. No.: WO97/40654

PCT Pub. Date: Oct. 30, 1997

[30] Foreign Application Priority Data

Apr. 24, 1996 [JP] Japan .................................... 8-127783

[51] Int. Cl.[7] ....................................................... H05K 1/00

[52] U.S. Cl. .......................... 257/659; 257/660; 257/661; 257/676; 257/687; 257/700

[58] Field of Search .................................... 257/659, 660, 257/661, 676, 687, 700

[56] References Cited

U.S. PATENT DOCUMENTS

| | | | |
|---|---|---|---|
| 5,151,770 | 9/1992 | Inoue . | |
| 5,151,771 | 9/1992 | Hiroi et al. | 257/676 |
| 5,286,926 | 2/1994 | Kimura et al. . | |

FOREIGN PATENT DOCUMENTS

| | | |
|---|---|---|
| 0 408 228 | 1/1991 | European Pat. Off. . |
| 0 503 200 | 9/1992 | European Pat. Off. . |
| 59-162762 | 10/1984 | Japan . |
| 1-78037 | 5/1989 | Japan . |
| 3-214691 | 9/1991 | Japan . |
| 5-79995 | 10/1993 | Japan . |

OTHER PUBLICATIONS

Patent Abstracts of Japan, vol. 017, No. 504 (E–1430) Sep. 10, 1993, JP–A–05 129 793 (Abstact) May 25, 1993.

*Primary Examiner*—Fetsum Abraham
*Attorney, Agent, or Firm*—Dellett and Walters

[57] ABSTRACT

It is the object to minimize a magnetic influence, on the outside, of a semiconductor chip which is formed on a substrate includes inductor conductors. A semiconductor chip 2 including inductor conductors is mounted on a substrate 1 and a plurality of through holes 8 are formed in the area on the outside of the mounting position. Shielding members 4 are formed on the chip mounting side and the opposite side of the substrate 1 and in the through holes 8 so as to cover the semiconductor chip 2 with the shielding members 4 from both sides of the substrate 1. Therefore, magnetic fluxes from a circuit formed on the semiconductor chip 2 do not leak out from the shielding members 4, but circulate inside the shielding members 4.

6 Claims, 3 Drawing Sheets

3
8
4a 4c 4b
4
2
1
6

F/G. 3
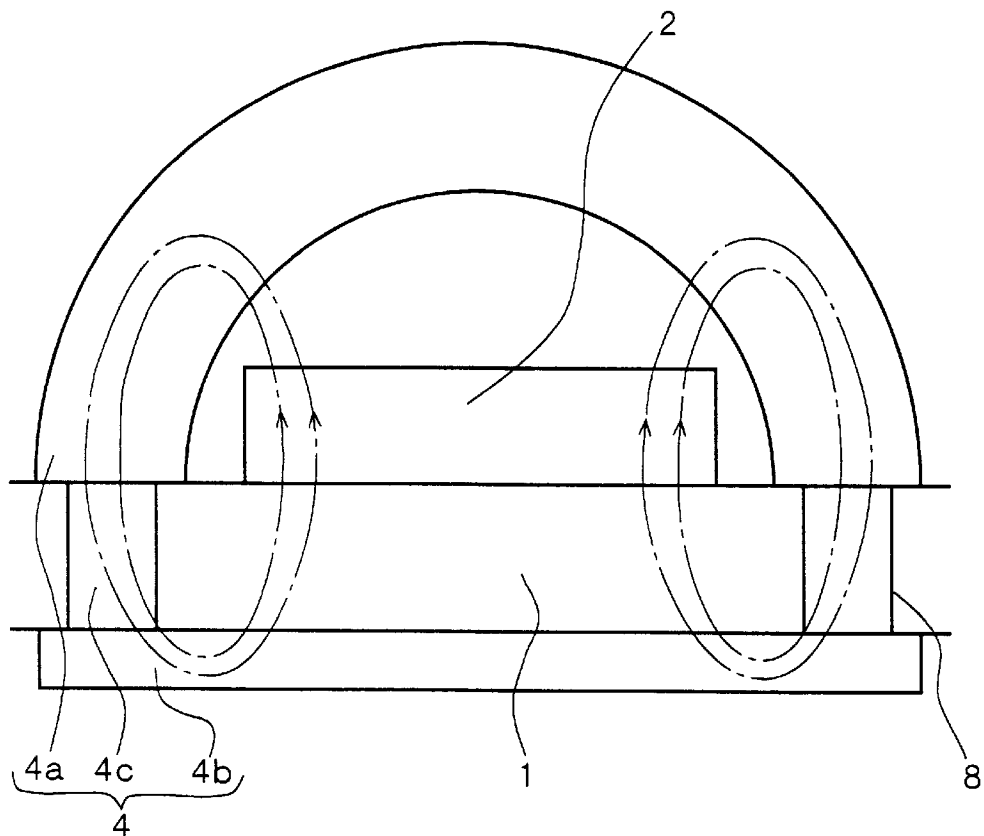
F/G. 4
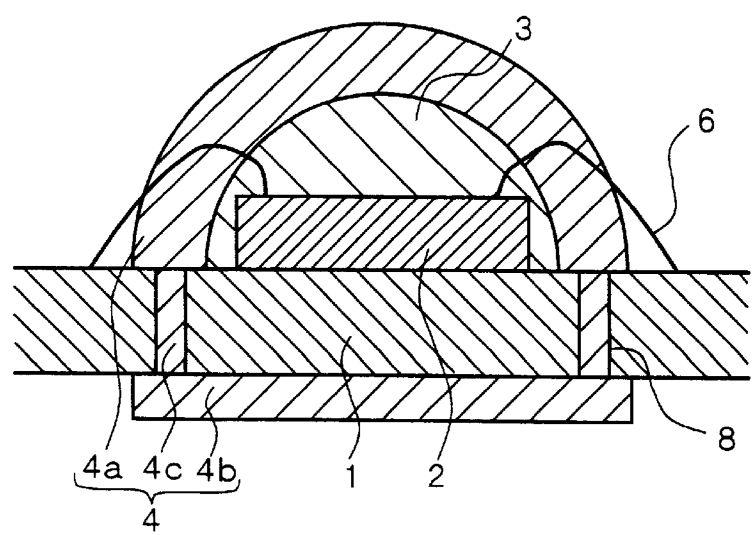

SEMICONDUCTOR DEVICE HAVING MAGNETIC SHIELD LAYER CIRCUMSCRIBING THE DEVICE

TECHNICAL FIELD

The present invention relates to a semiconductor device capable of providing a magnetic shield against a semiconductor chip including inductor conductors formed on a substrate.

BACKGROUND ART

Coils are generally essential circuit constituent parts and are indispensable parts for some circuits to be constituted. For example, oscillation circuits utilizing LC resonance or tuning circuits contained in a transmitter-receiver could not be implemented without using the coils.

However, the coils contained in the circuit generate magnetic fluxes, so that there is a need for such a design as to prevent the magnetic fluxes from affecting the surrounding components. For example, two coils must be disposed away from each other on a printed wiring board, or if approximate arrangement of a plurality of coils is desired, the direction of the magnetic fluxes must be allowed for in order to ensure a proper arrangement.

FIG. 5 illustrates three coils adjacent to one another, with the direction of the arrangement contrived. As shown in the diagram, the three coils are arranged in such a manner that two adjacent coils are disposed at 90 degrees relative to each other so as to allow magnetic fluxes generated from the adjacent coils to be orthogonal to each other. By allowing the magnetic fluxes generated from the adjacent coils to be orthogonal to each other in this manner, it is possible to suppress the magnetic coupling between the coils to a minimum.

By the way, such a conventional method allowing the magnetic fluxes to be orthogonal to each other as a result of the contrived direction of arrangement of the coils to minimize the magnetic coupling between the coils, is limited to the case where the coils are arranged on the printed wiring board.

In case spirally shaped inductor conductors are formed on the semiconductor substrate by use of a thin film formation techniques, the direction of generation of the magnetic fluxes is limited to the direction orthogonal to the semiconductor substrate. For this reason, the adjacently shaped coils in the form of inductor conductors are magnetically coupled with one another, so that it is inconvenient when it is desired that they be electrically separated as circuit elements. In particular, in cases where passive elements such as inductor conductors together with various active elements are formed on the semiconductor substrate, it is typical to reduce the size of the entire circuit by using the semiconductor fabrication technique, with the result that it becomes difficult to arrange in a fully separate manner a plurality of inductor conductors contained in the circuit.

FIG. 6 is a diagram for explaining the state of the magnetic fluxes generated from the semiconductor circuit containing inductor conductors formed on the semiconductor substrate. When a current flows into the inductor conductors within the semiconductor circuit shown in the diagram, magnetic fluxes occur in the direction substantially orthogonal to the surface of the semiconductor substrate as indicated by an arrow a of the diagram. These magnetic fluxes affect the actions of the other semiconductor elements formed on the semiconductor substrate, often causing noises or malfunctions.

DISCLOSURE OF THE INVENTION

The present invention was conceived in view of the above respects. It is therefore the object of the present invention to provide a semiconductor device capable of minimizing a magnetic influence, on the outside, of a semiconductor chip including inductor conductors formed on a substrate.

In the semiconductor device of the present invention, the semiconductor chip mounted on the substrate and including inductor conductors is covered by shielding members formed on both sides of the substrate in such a manner as to include the interior of through holes. This allows magnetic fluxes generated from a circuit formed on the semiconductor chip to circulate within the shielding members, preventing the magnetic fluxes from leaking out to the exterior of the shielding members.

In particular, in cases where the through holes are formed outside the substrate pads to which bonding wires are connected, it is possible to cover the entire bonding wires by the shielding members, thereby securely preventing any breakage of the bonding wires. In cases where the through holes are formed inside the substrate pads, it is possible to reduce the external dimensions of the shielding members, thereby achieving a reduction in size of the entire semiconductor device.

Upon the mounting of the semiconductor chip on the substrate, it is typical to form a sealing medium on top of the surface of the semiconductor chip. The shielding members are formed on this sealing medium so that the conventional fabrication processes can be utilized intactly to provide a magnetic shield. The distance between the adjacent through holes is set to a wavelength or below, the wavelength being given as an inverse number of an operating frequency of a circuit formed on the semiconductor chip, whereby it is possible to reduce the amount of magnetic fluxes leaking through between the through holes.

BRIEF DESCRIPTION OF THE DRAWINGS

FIG. 3 is a diagram illustrating flows of magnetic fluxes in the vicinity of a semiconductor chip shown in FIG. 2;

FIG. 4 is a sectional view of a semiconductor device in accordance with a second embodiment;

BEST MODE FOR CARRYING OUT THE INVENTION

Figure 1:
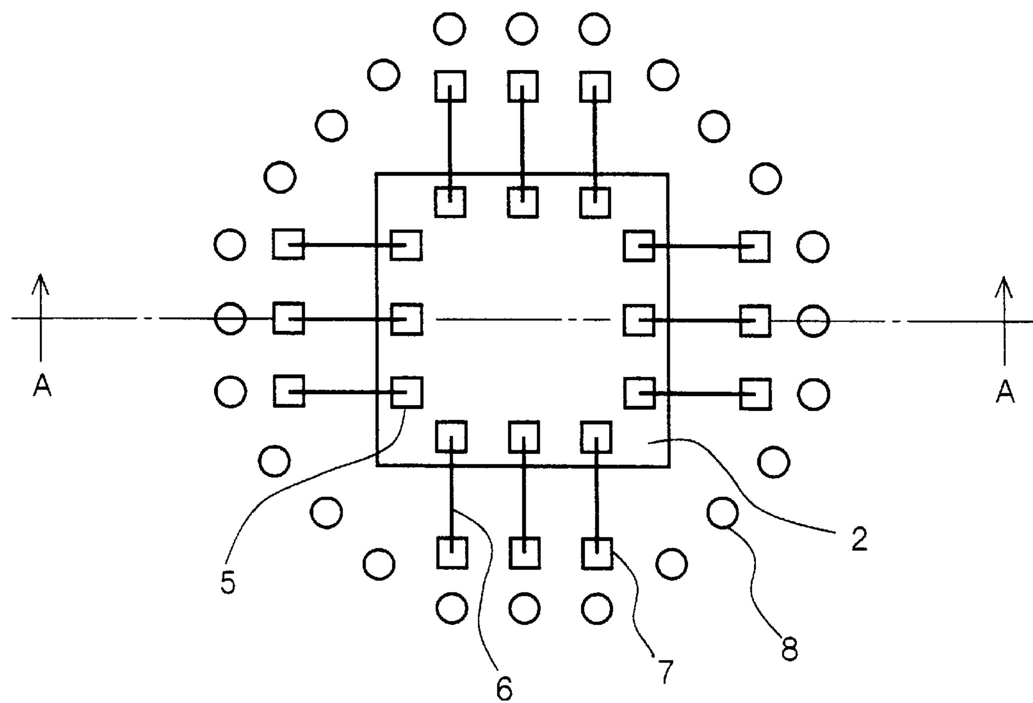
FIG. 1 is a top plan view of a semiconductor device in accordance with a first embodiment.
Figure 2:
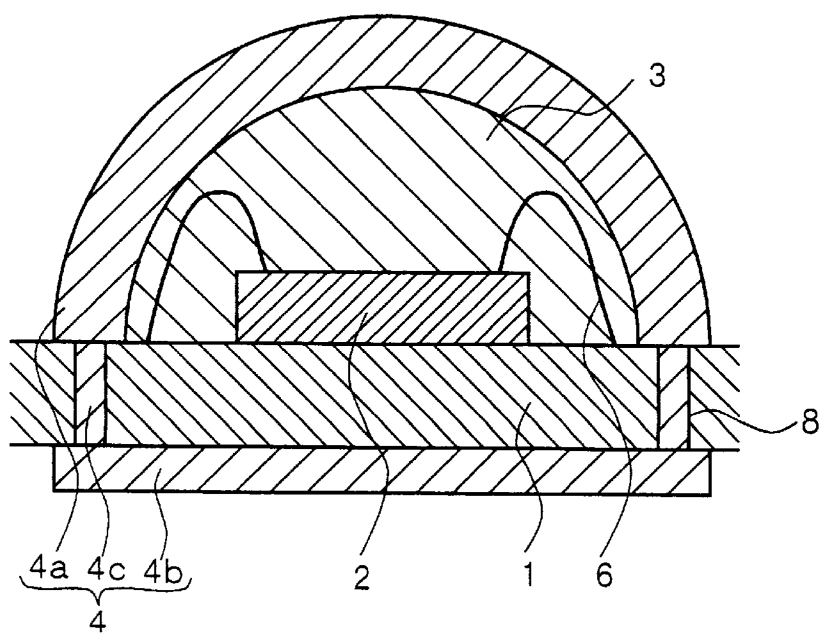
FIG. 2 is a sectional view taken along a line A—A of FIG. 1.
Figure 5:
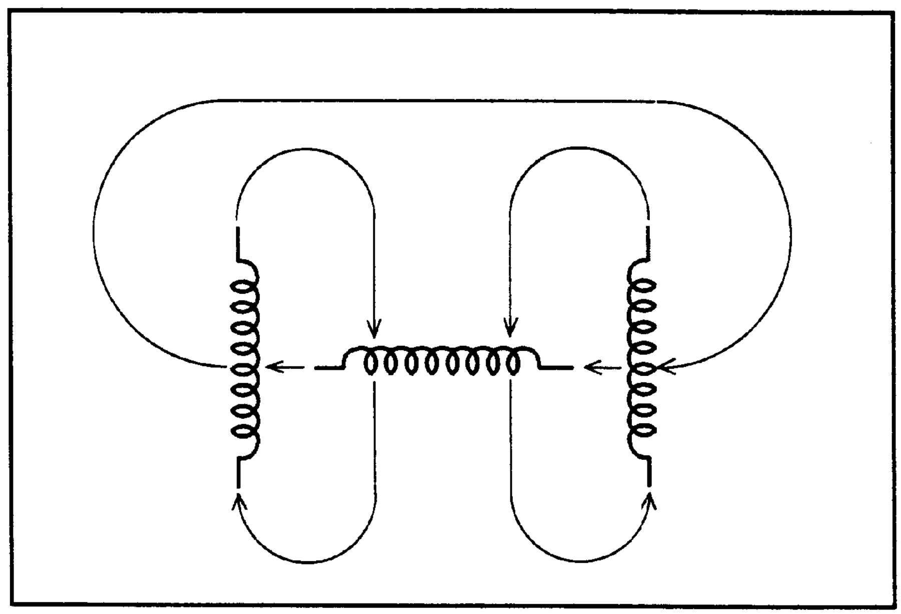
FIG. 5 is a diagram illustrating an arrangement of three adjacent coils, with the direction of the arrangement contrived.
Figure 6:
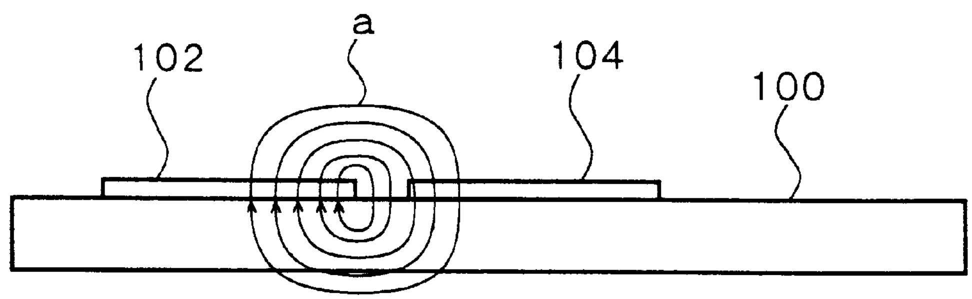
FIG. 6 is a diagram showing a state of magnetic fluxes generated from a semiconductor circuit including inductor conductors formed on a substrate.

FIG. 1 is a top plan view of a semiconductor device in accordance with a first embodiment, and FIG. 2 is a sectional view taken along a line A—A of FIG. 1. As is apparent from these diagrams, the semiconductor device of this embodiment comprises a semiconductor chip 2 mounted on a substrate 1, a sealing medium 3 for protecting the semiconductor chip 2, and shielding members 4 formed on the surface of the sealing medium 3 for providing a magnetic shield. The substrate 1 can typically be for example a ceramic or glass epoxy substrate.

The semiconductor chip 2 shown in FIGS. 1 and 2 includes spirally formed inductor conductors, active elements such as transistors and diodes, and passive elements such as resistors and capacitors. The material of the inductor conductors can be for example a thin metal film of aluminum, gold, etc., or a semiconductor material such as polysilicon.

The semiconductor chip 2 may be mounted in its finished state on the substrate 1 shown in FIG. 1, or alternatively may be formed on the substrate 1 as a base by use of known semiconductor fabrication techniques such as vapor deposition or ion implantation.

On top of the surface of the semiconductor chip 2 as can seen in FIG. 1 are formed a plurality of bonding pads 5 for receiving/sending signals from/to the exterior of the chip, with each bonding pad 5 being fitted with a bonding wire 6. These bonding wires 6 are connected to substrate pads 7 formed on the substrate 1. The substrate 1 has a plurality of through holes 8 equally spaced apart from one another so as to surround the substrate pads 7 as shown in FIG. 1.

The sealing medium 3 is formed in such a manner as to cover the surfaces of the semiconductor chip 2 and of the bonding wires 6. The material of the sealing medium 3 can be for example an insulating material such as epoxy resin. The shielding members 4 are provided to cut off magnetic fluxes arising from a circuit formed on the semiconductor chip 2. The shielding members 4 are formed, including the interior of the through holes 8, on both the chip mounting surface side of the substrate 1 and on the side opposite to the chip mounting surface. More specifically, a shielding member 4*a* on the chip mounting surface side is formed including the through holes 8 so as to cover the semiconductor chip 2, whereas a shielding member 4*b* on the side opposite to the chip mounting surface is formed including the through holes 8 so as to extend in substantially a planar state. The interior of the through holes 8 is filled with a shielding member 4*c* so that the shielding members 4 cover the semiconductor chip 2 on the opposed sides of the substrate 1.

The material of the shielding members 4 can be an insulating or conducting magnetic material. For instance, films of various magnetic materials such as gamma ferrite, barium ferrite, etc., are available. In particular, the gamma ferrite used typically as a magnetic storage medium provides a direction of magnetization which might be obtained by minute magnetics arranged in the direction of plane parallel to the substrate on which the gamma ferrite thin film is formed. This is convenient in magnetically coupling the inductor conductors within the semiconductor chip 2 with the shielding members 4. Use of the barium ferrite would allow a formation of a magnetic material film by coating, leading to an easy fabrication.

Various materials of magnetic material films and various methods of forming the same are conceivable. For instance, there are available a method of forming a magnetic material film by vacuum depositing $F_eO$ etc., and other methods including a molecular beam epitaxy method (MBE method), a chemical vapor deposition method (CVD method) and a sputtering method.

FIG. 3 is a diagram showing a flow of magnetic fluxes in the vicinity of the semiconductor chip 2 depicted in FIG. 2, with a section in the region of the semiconductor chip 2 illustrated in an enlarged scale.

As can be seen in the diagram, the shielding members 4 formed on the opposed sides of the substrate 1 covers the semiconductor chip 2 and forms magnetic paths. Accordingly, after generation from the inductor conductors in a direction substantially orthogonal to the semiconductor chip 2, the magnetic fluxes flow from the shielding member 4*a* on the upper surface side of the substrate 1 through the shielding member 4*c* within the interior of the through holes 8 into the shielding member 4*b* on the lower surface side and then returns to the upper surface side shielding member 4*a*. For this reason, the magnetic fluxes are prevented from leaking out of the shielding members 4, thereby minimizing a magnetic influence on the exterior of the magnetic fluxes generated from the circuit formed on the semiconductor chip 2.

Incidentally, since the substrate 1 is provided with the through holes 8 equally spaced apart from one another, the magnetic fluxes may possibly leak out through between the adjacent through holes 8 to the exterior. To prevent this, the intervals of the through holes 8 are preferably set to a wavelength or below, the wavelength being given as an inverse number of the operating frequency of the circuit formed on the semiconductor chip 2.

Description will then be made of the outline of a process of fabricating the semiconductor device depicted in FIG. 1. As described earlier, a finished semiconductor chip 2 is mounted on the substrate 1 or alternatively a semiconductor chip 2 is formed on the substrate 1 by means of a known fabrication process. The bonding wires 6 extended from the semiconductor chip 2 are connected to the substrate pads 7 positioned on the substrate 1, after which a liquid sealing medium 3 is applied to the peripheries of the semiconductor chip 2 and of the bonding wires 6 and is set up. The conventional fabrication processes are applicable intactly to the above processes.

A plurality of through holes 8 are then formed outside of the position of the semiconductor chip mounted on the substrate 1. Besides, the substrate 1 may previously be formed with the through holes 8. Then, using the through holes 8 as the reference positions, a magnetic material film is for example vapor deposited on the surface of the sealing medium 3 to form the shielding members 4. At that time, the shielding members 4 are filled into the interior of the through holes 8. Then, the magnetic material film is for example vapor deposited on the substrate 1 on the side opposite to the surface mounted with the chip, so as to extend in substantially a planar state including the through holes 8. It is to be appreciated that the surface of the shielding members 4 may be coated with epoxy resin, etc.

In the case of the semiconductor device of the first embodiment in this manner, the substrate 1 is provided with the plurality of through holes 8 for filling the shielding members therein so that the semiconductor chip 2 is covered by the shielding members 4 on the opposed sides of the substrate 1, whereby it is possible for the shielding members 4 to effectively cut off magnetic fluxes arising from the circuit formed on the semiconductor chip 2, thus eliminating any possible magnetic adverse effect on the other components mounted on the substrate 1.

Furthermore, the conventional fabrication processes are applicable intactly to the processes from the mounting of the semiconductor chip 2 onto the substrate 1 up to the sealing thereof by the sealing medium 3, so that it is possible to provide an effective magnetic shield without significantly changing the fabrication processes, suppressing the rise in fabrication costs to a minimum.

Second Embodiment

Although in the first embodiment description has been made of the case where the through holes 8 are formed outside of the substrate pads 7, the through holes 8 may be formed between the mounting position of the semiconductor chip 2 and the substrate pads 7.

FIG. 4 is a sectional view of a semiconductor device in accordance with a second embodiment. In the diagram, the same reference numerals are imparted to the same constituent parts as those of the semiconductor device of the first embodiment, and hereinafter differences therebetween will mainly be described.

As is apparent from FIG. 4, the through holes 8 of the second embodiment are formed between the mounting position of the semiconductor chip 2 and the substrate pads 7. The shielding members 4 are formed including the through holes 8 in the same manner as the first embodiment, with the bonding wires 6 extending through the shielding members 4 and being connected to the substrate pads 7 on the substrate 1 at the outside of the shielding members 4. The shielding members 4 are made of an insulating magnetic material so as to prevent the bonding wires 6 from short-circuiting with one another. The other configurations are the same as those of the first embodiment, including that the semiconductor chip 2 is magnetically shielded by the shielding members 4 formed on the opposed sides of the substrate 1 and filled into the interior of the through holes 8.

In this manner, the semiconductor device of the second embodiment allows the through holes 8 to be formed between the substrate pads 7 and the mounting position of the semiconductor chip 2, so that the external dimensions of the shielding members 4 can be smaller than those of the first embodiment to realize a high-density mounting on the substrate 1.

Although in the above embodiments description has been made of the example where the shielding members 4 made of the same magnetic material are formed on the chip mounting surface side of the substrate 1 and on the side opposite to the chip mounting surface and into the interior of the through holes 8, different materials may separately be used to form the shielding members 4. In particular, due to the fact that the interior of the through holes 8 has a higher magnetic flux density as compared with the chip mounting surface and the surface opposite to the chip mounting surface, the interior of the through holes 8 and the other portions may separately be formed with different magnetic materials in order to prevent the magnetic fluxes from saturating.

Although in the above embodiments description has been made of the example where the semiconductor chip 2 includes transistors and other active elements in addition to the inductor conductors, the same effect as that of the above embodiments could be obtained also in cases where only the inductor conductors are formed on the substrate 1, by covering the inductor conductors by the shielding members 4.

Although in the above embodiments description has been made of the example where the sealing medium 3 is formed between the semiconductor chip 2 and the shielding members 4, the sealing medium 3 may be excluded so that the shielding members are directly formed on the semiconductor chip in order to provide a protection for the semiconductor chip.

Although in the above embodiments description has been made of the example where the semiconductor chip 2, the sealing medium 3, etc., are formed on the substrate 1, the substrate 1 may be replaced by a printed wiring board. In this case, the semiconductor chip 2 is mounted on the printed wiring board and the through holes 8 are formed in the printed wiring board around the semiconductor chip 2, with the shielding members 4 formed including the through holes 8 on the two opposed surfaces of the printed wiring board. Such a COB (Chip On Board) mounting prevents magnetic fluxes arising from the semiconductor chip 2 including the inductor conductors from leaking out to the exterior of the shielding members, thereby eliminating any possible magnetic adverse effect on the other components mounted on the printed wiring board, to realize a high-density mounting onto the printed wiring board.

Although in the above embodiments a ceramic or glass epoxy substrate has been used as the substrate 1, the substrate 1 may be a semiconductor substrate made of n-type silicon (n-Si) or other semiconductor material (e.g., amorphous material such as germanium or amorphous silicon).

Although FIG. 1 illustrates the example where the substrate 1 is formed with a plurality of circular through holes 8, the through holes could be of any other contour (e.g., rectangular section) than the circular section. The dimensions and the number of the through holes are not limited to FIG. 1. For example, a groove-like through hole may be formed around the semiconductor chip 2.

Although in the above embodiments description has been made of the case where the semiconductor chip 2 is COB mounted on the substrate 1 by use of the wire bonding, the present invention is applicable to the other mounting method, for example, in which the semiconductor chip 2 is flip-chip mounted on the substrate 1.

INDUSTRIAL APPLICABILITY

According to the present invention as set forth hereinabove, the through holes are formed in the substrate outside the mounting position of the semiconductor chip including the inductor conductors. The shielding members are formed in the interior of the through holes and on the semiconductor chip mounting surface of the substrate and on the side opposite to the mounting surface so as to cover the semiconductor chip, whereby the magnetic fluxes generated from the circuit formed on the semiconductor chip are allowed to circulate within the interior of the shield, eliminating any possible magnetic adverse effect on the exterior.

What is claimed is:

1. A semiconductor device comprising:

a semiconductor chip mounted on a substrate and including inductor conductors;

a plurality of through holes formed on said substrate outside a mounting position of said semiconductor chip; and shielding members formed on a surface of said substrate on which said semiconductor chip is mounted, said shielding members formed on a reverse surface of said substrate corresponding to said mounting position of said semiconductor chip, said shielding members filled in the interior of said through holes, said shielding members covering said semiconductor chip; thereby providing a magnetic shield against a circuit formed on said semiconductor chip.

2. A semiconductor device according to claim 1, wherein said semiconductor chip is fitted with bonding wires; and wherein with respect to said mounting position of said semiconductor chip as the reference, said through holes are formed outside of substrate pads formed on said substrate.

3. A semiconductor device according to claim 1, wherein said semiconductor chip is fitted with bonding wires; and wherein said though-holes are formed between substrate pads formed on said substrate and said mounting position of said semiconductor chip.

4. A semiconductor device according to claim 1, wherein a sealing medium for protecting said semiconductor chip is formed on the surface of said semiconductor chip; and wherein said shielding members are made of a conducting or insulating magnetic material and are formed on top of the surface of said sealing medium.

5. A semiconductor device according to claim 1, wherein the distance between adjacent said through holes is set to a wavelength or below, said wavelength being given as an inverse number of an operating frequency of a circuit formed on said semiconductor chip.

6. A semiconductor device according to claim 1, wherein a printed wiring board is used as said substrate.

* * * * *